USOO5635840A

United States Patent [19]
Horigane et al.

[11] Patent Number: 5,635,840
[45] Date of Patent: Jun. 3, 1997

[54] APPARATUS INCLUDING SAMPLE SUPPORT MEMBER FOR SUPPORT AND ISOLATION OF A SAMPLE TRANSFER DEVICE AND RF DETECTION UNIT FROM THE STATIC AND GRADIENT COILS

[75] Inventors: Akira Horigane; Ushio Matsukura, both of Tsukuba; Masayoshi Kamio, Tsuchiura, all of Japan

[73] Assignee: Director General of National Agriculture Research Center, Ibaraki, Japan

[21] Appl. No.: 409,447

[22] Filed: Mar. 24, 1995

[30] Foreign Application Priority Data

Mar. 2, 1995 [JP] Japan ................................. 7-043315

[51] Int. Cl.[6] ........................................... G01R 33/30
[52] U.S. Cl. ............................................... 324/321
[58] Field of Search ............................ 324/300, 306, 324/307, 308, 309, 310, 311, 312, 313, 314, 318, 322, 321; 128/653.2, 653.3

[56] References Cited

U.S. PATENT DOCUMENTS

| | | | |
|---|---|---|---|
| 4,390,957 | 6/1983 | Skarlos et al. | 324/300 |
| 4,581,583 | 4/1986 | Van Vliet et al. | 324/321 |
| 4,859,948 | 8/1989 | Kuster | 324/318 |
| 4,866,385 | 9/1989 | Reichwein | 324/306 |
| 5,235,276 | 8/1993 | Lew | 324/309 |

FOREIGN PATENT DOCUMENTS

| | | |
|---|---|---|
| 629 873 | 12/1994 | European Pat. Off. . |
| 93/10468 | 5/1993 | WIPO . |

*Primary Examiner*—Sandra L. O'Shea
*Assistant Examiner*—Roger C. Phillips
*Attorney, Agent, or Firm*—Flynn, Thiel, Boutell & Tanis, P.C.

[57] ABSTRACT

An apparatus and a method for magnetic resonance imaging of a sample to be inspected without the sample chamber to be taken out of the apparatus under omission of renewed operation of tuning and shimming on each test, by excluding transmission of any vibration of the static and the gradient magnetic field generating elements to the detection unit, which includes supporting, within a hollow core space (4) in static and gradient magnetic field generating elements (1) and (2), a detection unit (10) composed of a sample chamber (11) and an RF-emission-reception set (12) including an RF coil (13) by a support member (14), such that they are isolated from said static magnetic field generating element (1) and from said gradient magnetic field generating element (2); performing the sample exchange by guiding the sample (15) into said sample chamber (11) via a sample transfer line (18) by making use of a vacuum and compressed air; building up a gradient magnetic field while the sample chamber (11) is charged with the sample (15); and effecting, by the RF coil (13), the emission of an RF pulse series and reception of the magnetic resonance signals for the sample to obtain the magnetic resonance image and the corresponding image spectrum.

3 Claims, 5 Drawing Sheets

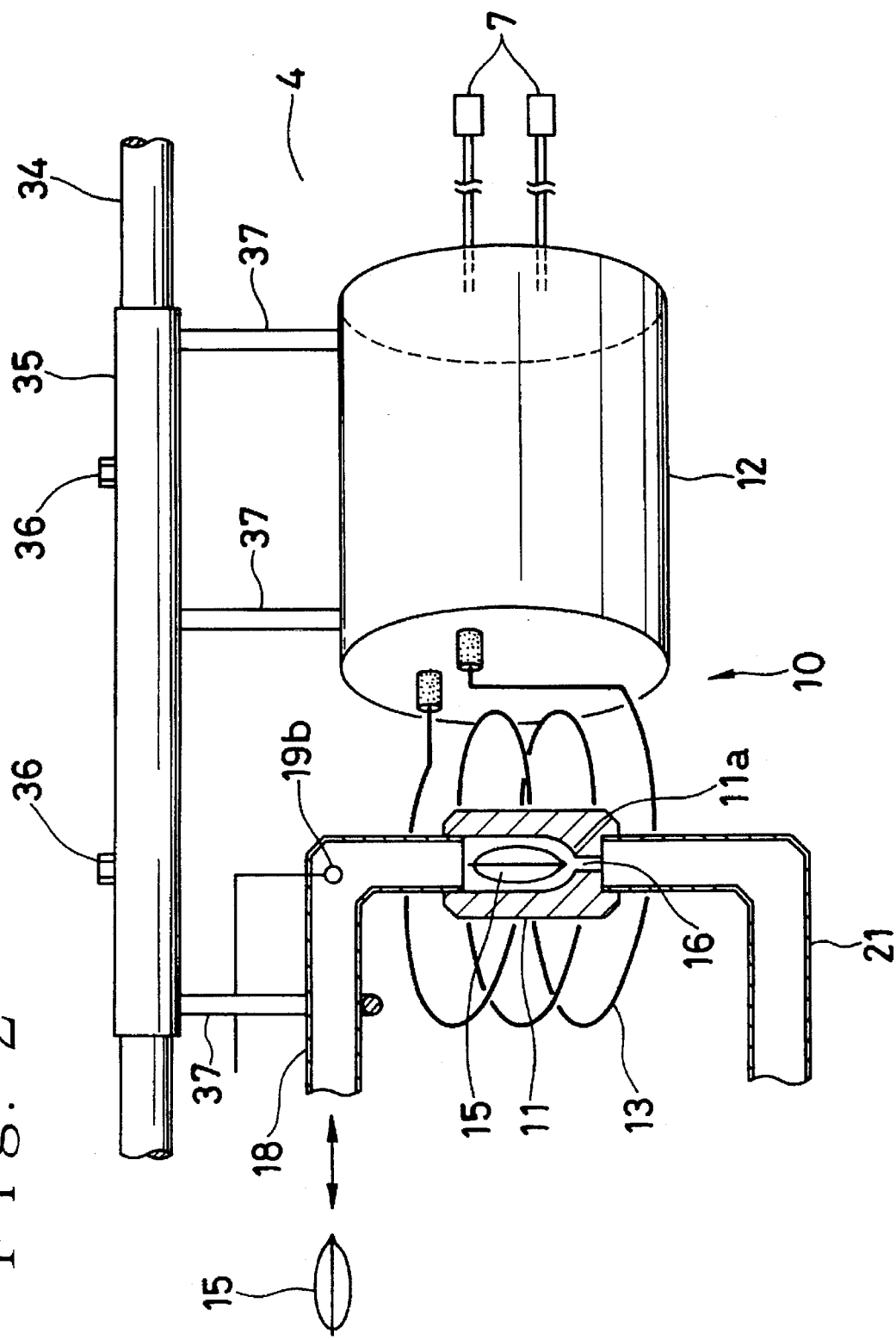

Fig. 3(b)
Fig. 3(a)
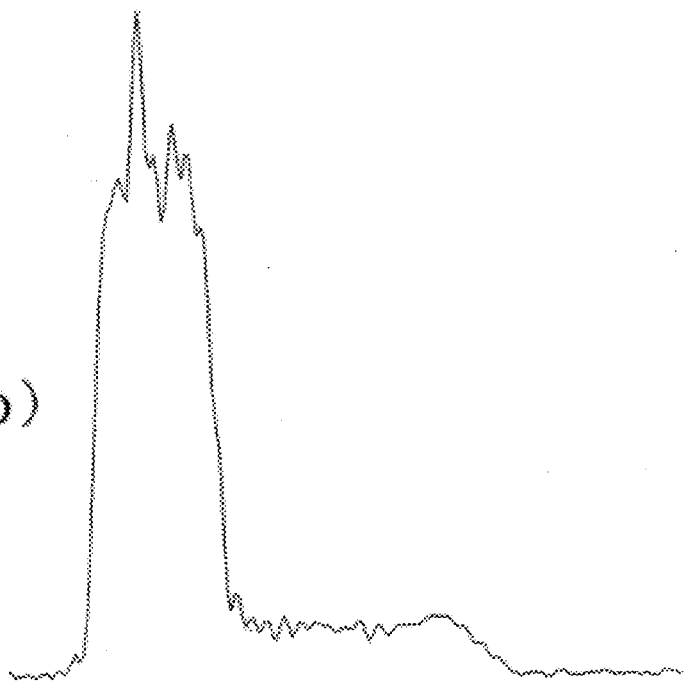
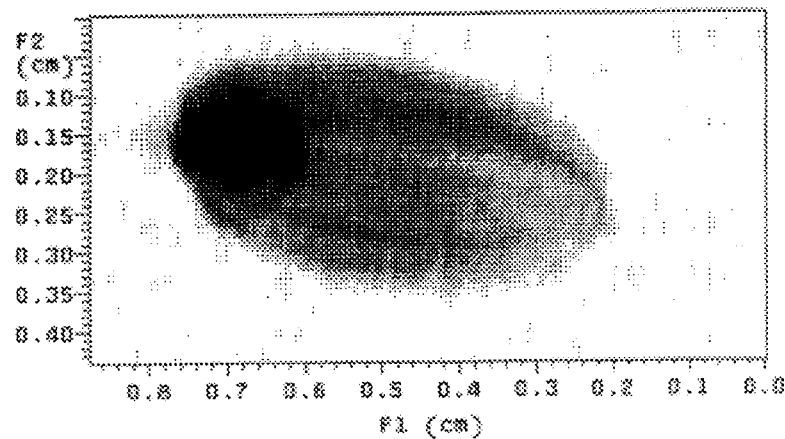

APPARATUS INCLUDING SAMPLE SUPPORT MEMBER FOR SUPPORT AND ISOLATION OF A SAMPLE TRANSFER DEVICE AND RF DETECTION UNIT FROM THE STATIC AND GRADIENT COILS

FIELD OF THE INVENTION

The present invention relates to an apparatus and method for magnetic resonance imaging (MRI) and, more specifically, to an apparatus and method for MRI adapted to use for nondestructive quality assessment and analysis of samples of biological objects, foods, chemicals and so on.

BACKGROUND OF THE INVENTION

An MRI apparatus permits imaging and spectral analysis of the internal structure of a sample to be performed in a nondestructive manner by making use of a reaction of the atomic nucleus of, for example, hydrogen atom, phosphorus atom, $^{13}C$ atom and so on, with a radio frequency electromagnetic wave (RF, for example, 200 MHz for hydrogen atom) in a powerful electromagnetic field generated by, for example, a superconducting magnet, to cause resonance therewith. MRI apparatuses have been used in the medical field widely for clinical tests for the diagnosis of tumors, intracerebral bleeding and so on.

MRI permits an image diagnosis and spectral analysis of the internal structure of a sample to be inspected, based on the phenomenon of magnetic resonance (MR) of atomic nucleus of, for example, hydrogen atoms, and can realize a nondestructive inspection of the internal structure and chemical composition of the sample. It is also employed for nondestructive visual quality assessments of samples by permeative visual inspection and for analyses of the chemical composition of materials as well, since it permits permeative access through materials and provides a spectrum corresponding to the functional groups of the molecules of the material. The MRI apparatuses to be used for the nondestructive quality assessments and analyses of samples are also based on the same principle as the MRI apparatuses for medical diagnosis, so that both have nearly the same construction.

In the appended FIG. 5, a conventional MRI apparatus used for nondestructive quality assessments and analyses etc. of samples is shown in a perspective view. In FIG. 5, the numeral 1 indicates a static magnetic field generating element consisting of, for example, a superconducting magnet, which is designed in a horizontal cylindrical form and provided on its inner circumference with a gradient magnetic field generating element 2, totally supported on a supporting stand 3. In the hollow core space 4 of the static magnetic field generating element 1, a cradle 6 carrying a cylindrical probe 5 is inserted to permit its guiding into or out of the core space. The cylindrical probe 5 has internally an RF-emission-reception set including an RF coil and a condenser and, externally, a tuner shunk 7 projecting out of it. The MRI apparatus is controlled by a control device including a computer, which is not shown.

In the above MRI apparatus, a sample holder (not shown) charged with a sample is placed on the cradle 6 and the cradle thus carrying the sample is then guided into the hollow core space 4 of the static magnetic field generating element 1 and is settled in position in the gradient magnetic field generating element 2. When a static magnetic field is formed in this state by the static magnetic field generating element 1, some disturbances in the static magnetic field occur due to the presence of the sample, the cylindrical probe 5 and the cradle 6 in the hollow core space 4, so that shimming of the magnetic field to homogenize the static magnetic field has to be performed. On the other hand, the RF-emission-reception set accomodated in the cylindrical probe 5 is adjusted to the resonance frequency by means of the tuner shunk 7. Then, the gradient magnetic field generating element 2 is actuated by energizing the coil thereof while causing an RF pulse to be emitted from the RF coil of the RF-emission-reception set, in order to build up the resonance. The MR signals are received by the RF-emission-reception set while ceasing the emission of the RF pulse, whereupon the signals are processed by the computer into a series of image signals to obtain the MR image.

However, conventional MRI apparatuses for quality assessment and for analytical uses are not satisfactory in adaptability for such uses, since they are designed on the same principle as those for medical diagnosis. MRI apparatuses directed to applications for quality assessment, analysis etc. of samples which are far smaller than human bodies to be inspected in medical diagnosis should require, thus, performances different from those for medical diagnosis.

For instance, when a plurality of samples are to be inspected, the procedure of sample exchange is carried out after the cradle 6 has been withdrawn from the hollow core space. The cradle carrying now an exchanged sample is then re-inserted into the static magnetic field in the hollow core space to subject it to a further MR inspection. After the sample is reset, the exact positions of the probe 5, cradle 6, the sample and so on may slightly deviate from those in the foregoing MR inspection. The observation error caused therefrom may reach a large value for a small sample, so that the procedures of tuning and shimming must be carried out anew on each sample exchange. If the renewal of these procedures is not performed sufficiently, the accuracy of the analysis decreases and the efficient progress of tests for a large number of samples will not be attained.

The gradient magnetic field is not constantly maintained but is formed upon each observation. When a gradient magnetic field is formed in a static magnetic field, an interference occurs between the static and the gradient magnetic fields, whereby a shock wave is generated. Since, however, the formation of the gradient magnetic field is effected in response to the emission sequence of RF pulses, a problem occurs in that the shock wave will have an influence on the MR signals received after the emission of the RF pulses and a precise MR image will not be obtained due to the shock wave.

SUMMARY OF THE INVENTION

An object of the present invention is to solve the above-mentioned problems and to provide an apparatus and a method for MR imaging of a sample to be inspected, in which an accurate MR image can be obtained at a high resolution, even when a large number of samples are to be tested, by realizing an efficient sample exchange.

The present invention provides, thus, an apparatus for magnetic resonance imaging of a sample to be inspected, which comprises a static magnetic field generating element for forming in its hollow core space a static magnetic field, a gradient magnetic field generating element for building up a gradient magnetic field within said static magnetic field, a detection unit composed of a sample chamber to be placed within said hollow core space and an RF-emission-reception set including an RF coil, a sample transfer device for guiding the sample into and out of said sample chamber, a support member for supporting said detection unit and said sample transfer device such that they are isolated from said static magnetic field generating element and from said gradient magnetic field generating element and a control device for controlling the apparatus so as to build up the gradient magnetic field by said gradient magnetic field generating element while the sample is positioned within the sample chamber and to conduct emission of an RF pulse and reception of the nuclear magnetic resonance signals by said RF-emission-reception set so as to effect an imaging of the sample.

The present invention proposes also a method for realizing a magnetic resonance imaging of a sample to be inspected, which comprises supporting, within a hollow core space in which a static magnetic field is formed by a static magnetic field generating element and a gradient magnetic field is built up by a gradient magnetic field generating element, a detection unit composed of a sample chamber and an RF-emission-reception set including an RF coil such that they are isolated from said static magnetic field generating element and from said gradient magnetic field generating element, guiding the sample into said sample chamber, and building up a gradient magnetic field by said gradient magnetic field generating element while causing emittion of an RF pulse and reception of the magnetic resonance signals from the sample by the RF-emission-reception set including the RF coil to obtain an MR image and corresponding spectrum.

The apparatus and the method for MRI according to the present invention are adapted for nondestructive assessment and analysis of transferable samples, such as biological objects, foods and drugs, in particular, a large number of small-sized samples, such as corns and cereals.

BRIEF DESCRIPTION OF THE DRAWING

FIG. 2 illustrates the detection unit of the apparatus also in a perspective view.

FIGS. 3(a) and 3(b) show an MR image of a grain of unmilled rice, with its corresponding MR spectrum being given in 3(b).

DETAILED DESCRIPTION OF THE INVENTION

Figure 1:
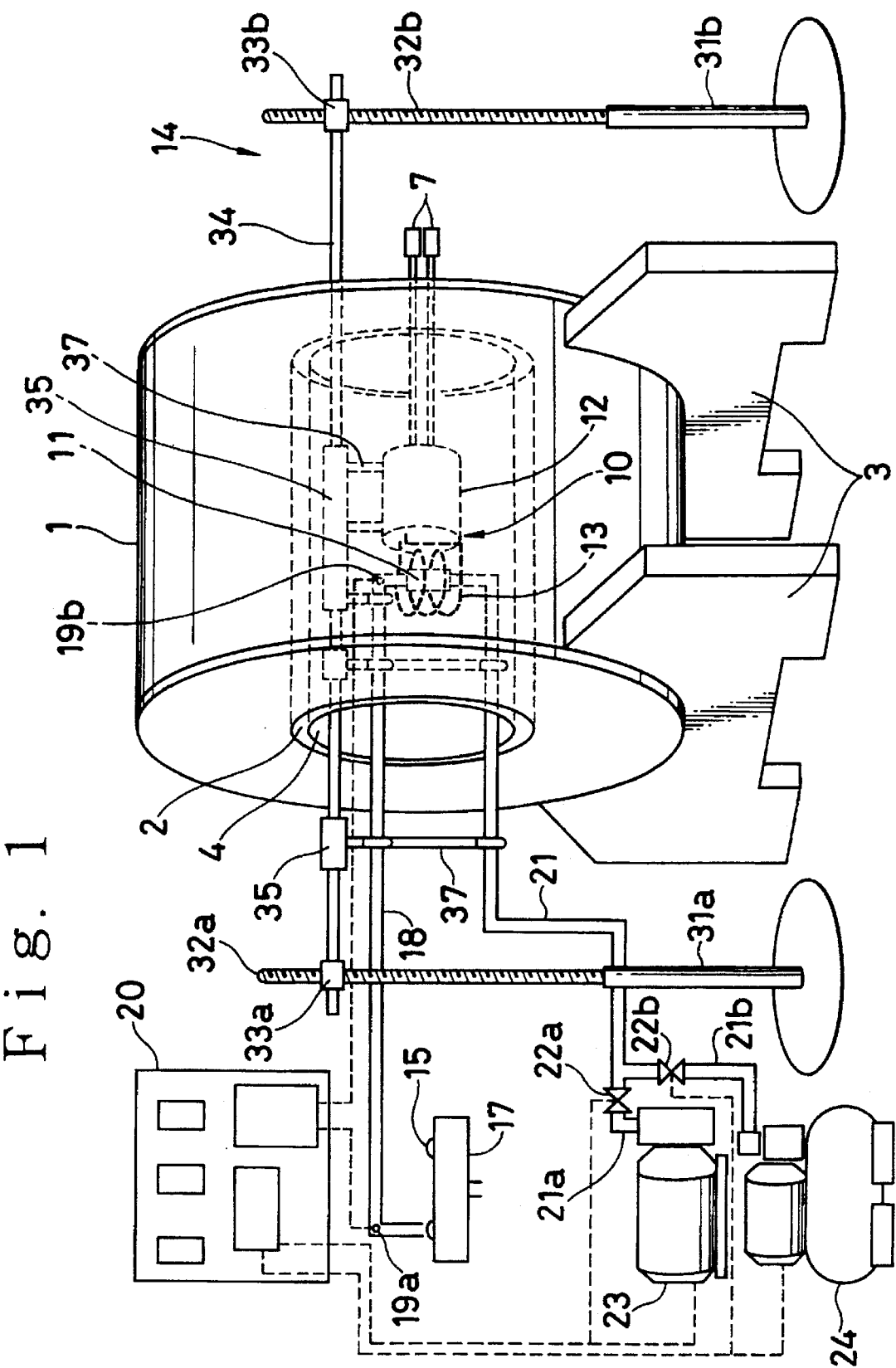
FIG. 1 illustrates the MRI apparatus of one embodiment of the invention given afterwards in a perspective view.

The basic construction of the elementary units of the MRI apparatus according to the present invention such as the static magnetic field generating element, the gradient magnetic field generating element and the RF-emission-reception set are the same as in conventional apparatuses and are available in the market. For the static magnetic field generating element, it is preferable to use a superconducting magnet designed in the form of a horizontal cylinder with a hollow core space. The gradient magnetic field generating element is designed so as to build up a gradient magnetic field with the direction of field gradient being changeable in the directions of X-, Y- and Z-coordinate axes. The RF-emission-reception set may be either in the form in which the emitter and the receiver are bodily integrated or in the form in which they are separately installed.

The detection unit is composed of a sample chamber and the RF-emission-reception set, in which a sample chamber adapted to put the sample into and out of the chamber and an RF-emission-reception set including an RF coil are combined integrally. The detection unit is supported on a support member and is disposed in the apparatus at a position isolated from both the static and the gradient magnetic field generating elements. The support member itself is preferably arranged such that it is isolated from both the static and the gradient magnetic field generating elements. It is preferable to design the support element so as to permit the adjustment of the position of the sample chamber. The sample transfer device is designed such that the sample can be guided into and out of the sample chamber, preferably under the control of a sample exchange control device, without altering the original position of the sample chamber.

The sample chamber, the sample transfer device and the support member may preferably be constituted of a non-magnetic material, such as a plastic, copper, titanium and so on.

By the MRI method according to the present invention, an MR image and corresponding spectrum are produced by the procedures, which comprises guiding the sample to be inspected into the sample chamber of the detection unit, which is supported on the support member and is located isolatedly from both the static and the gradient magnetic field generating elements within the hollow core space to be occupied by the static magnetic field generated by said element, by means of a sample transfer device controlled by a sample exchange control device, building up a magnetic field gradient across the sample by means of the magnetic field gradient generating element, while effecting emission of a series of RF pulses and reception of the MR signals by means of the RF-emmission-reception set, and subjecting the resulting FID signals (Free Induction Decay signals) to a Fourier conversion by means of a main control device.

The sample exchange procedure by the sample transfer device is carried out under the condition in which the detection unit including the sample chamber and the RF-emission-reception set is placed at a definite position within the hollow core space of the static magnetic field generating element. Therefore, no change of the position of the detection unit is caused by the sample exchange procedure. Thus, there is no need, according to the present invention, for a renewed operation of tuning and shimming upon each sample exchange. Only by effecting the operation of tuning and shimming once at the start of the successive tests, all the tests, including the sample exchange procedure, can be performed successively and efficiently without incorporating any renewal of the operation of tuning and shimming to obtain a high accuracy image and corresponding spectrum.

Since the detection unit is placed in the hollow core space at a definite position by supporting it on a support member such that it is isolated from both the static and the gradient magnetic field generating elements, trasmission of any vibration generated in the static and the gradient magnetic field generating elements to the detection unit is shut off. Since, therefore, the shock developed upon introduction of the gradient magnetic field in the static magnetic field due to the interference therebetween is not transmitted to the detection unit, a precise MR image and the corresponding spectrum can be obtained without having any influence by the shock vibration on the received MR signals.

When the sample transfer is effected by making use of a vacuum and compressed air, the force on the sample chamber upon the sample exchange can be decreased, so that any locational displacement of the sample chamber upon the sample exchange can be substantially excluded.

As described above, according to the present invention, the operation of the sample exchange can be effected without necessitating the withdrawal of the detection unit from the hollow core space of the static magnetic field generating element, since the detection unit is supported on the support member in a manner such that it is isolated from both the static and the gradient magnetic field generating elements and the sample exchange operation is effected by guiding the sample into and out of the definitely settled sample chamber by means of a special sample transfer device. In this manner, a renewed operation of tuning and shimming upon each sample exchange becomes unneccesary, so that the operation of sample exchange for a large number of samples can be realized efficiently, enabling the test procedures to be performed efficiently and with a high accuracy. Moreover, any transmission of the shock vibration generated by the interference between the static and the gradient magnetic fields to the detection unit can be shut off, so that contamination of the MR image and the spectrum with noises can be avoided, enabling accurate MR images and spectrum to be obtained.

By employing a vacuum and compressed air for the sample transference, the force to be imposed on the sample chamber upon the sample exchange is reduced, so that a possible displacement of the sample chamber is decreased, whereby the observation accuracy can be increased.

PREFERRED EMBODIMENT OF THE INVENTION

Below, the present invention will further be described in more detail by way of one embodiment with reference to the appended Drawings, in which an apparatus and a method of MRI are applied to a nondestructive assessment of the sproutability of a cereal seed (rice).

FIGS. 1 and 2 show the MRI apparatus and the detection unit of this embodiment, respectively, in a perspective view.

In FIGS. 1 and 2, it is seen that the MRI apparatus has a static magnetic field generating element 1 in the form of a horizontal hollow cylinder composed of a superconducting magnet and, on its internal circumference, a gradient magnetic field generating element 2 disposed coaxially and integrally therewith, which are supported on a supporting stand 3 and provided with a hollow core space 4 in the central portion. The MRI apparatus is operated under the control of a main control device including a computer, which is not shown.

A detection unit 10 is composed of a sample chamber 11 and an RF-emission-reception set 12 including an RF coil 13 and is disposed at a position which is isolated from the static and the gradient magnetic field generating elements 1 and 2 within the hollow core space 4, the detection unit 10 being supported on a support member 14 so as to permit it to be taken out of the apparatus.

The sample chamber 11 is made of a non-magnetic material and has a cylindrical form and is provided therein with a sample holder 11a which has an open passage 16 and is designed so as to hold the sample 15 in an immovable state. The sample chamber 11 communicates at its upper end with a sample transfer line 18 connected to a rotary type autosampler 17. The sample transfer line 18 is provided with passage sensors 19a and 19b for detecting passage of the sample on the side to the autosampler 17 and on the side to the sample chamber 11, respectively, which are connected to a sample exchange control device 20 to transmit thereto the detected signals. The sample chamber 11 communicates at its lower end with a suction-compression line 21 which is branched at its another end into two branch lines 21a and 21b, which are connected either to a vacuum pump 23 or to a compressor 24 via a valve 22a or 22b, wherein they (22a, 22b, 23 and 24) are operable under control by the sample exchange control device 20.

The RF-emission-reception set 12 includes capacitors, such as a trimmer capacitor, a chipping capacitor and the like, accomodated therein and an RF coil 13 extending out from one side end thereof and being arranged to wind around the sample chamber 11. Tuning shunks 7, which is to be used for adjusting the capacity of the trimmer condenser to effect the tuning, project out of the other side end of the RF-emission-reception set 12 so as to protrude from the core space 4 to the outside thereof.

The support member 14 consists of two support pillars 31a and 31b disposed on both sides of the static magnetic field generating element 1, each facing a side face thereof, and a carrier rod 34 which is slidable in its axial direction and spans between the pillars 31a and 31b by being supported at both its end portions on supporting knuckles 33a and 33b, which are each screwed on the threaded part 32a or 32b of the pillar so as to permit a screwing adjustment of their elevation. The carrier rod 34 is furnished with a sheath-like sleeve guide 35 which is fixed by a fixing screw 36 thereon and has a plurality of suspension rods 37 which extend downwards therefrom and carry the RF-emission-reception set 12, the sample transfer line 18 and the suction-compression line 21 by suspending them so as to permit the placing of the detection unit 10 at a predetermined position in the hollow core space 4 of the static magnetic field generating element.

The image production by the MRI apparatus is realized in the following manner:

The detection unit 10 composed of the sample chamber 11 and the RF-emission-reception set 12 mounted on the carrier rod 34 of the support member 14 and the assembly is guided into the hollow core space 4 and is placed at a predetermined position therein. Here, the height or elevation of the detection unit is adjusted by screwing the supporting knuckles 33a and 33b and the horizontal position thereof is adjusted by sliding the carrier rod 34 in its axial direction. Then, the static magnetic field generating element 1 and the gradient magnetic field generating element 2 are subjected to shimming and the tuning is effected by manipulating the tuning shunks 7 until a homogeniety of these magnetic fields is reached.

On the other hand, the sample exchange control device 20 is operated to give out command signals to cause the autosampler 17 to be filled with the sample 15 and the turn table thereof to be rotated to the position corresponding to the opening of the sample transfer line 18 for stand-by of transference of the sample 15. Then, in this state, the sample exchange control device 20 is operated to give the command signals to open the valve 22a, whereby the air in the sample chamber 11 is sucked out via the suction-compression line 21 and the sample 15 in the autosampler 17 is transferred to the sample chamber 11 via the sample transfer line 18 and is held on the sample holder 11a. Upon detection of the passage of the sample 15 through the transfer line by sensors 19a and 19b, the valve 22a is closed. So long as the sample holder 11a fits the sample 15, the sample is held stationary therein even if the valve 21a is closed. However, it may be permitted, if necessary, to hold the valve slightly opened to maintain a slight air sucking to cause the sample 15 to be held in the sample holder 11a by sucking.

After the sample 15 has been charged into the sample chamber 11 in this manner, while the static magnetic field is established therein by the static magnetic field generating element 1, the gradient magnetic field generating element 2 is actuated by the corresponding command signals from the main control device (not shown) to build up the gradient magnetic field and, at the same time, a series of RF pulses are caused to be emitted from the RF coil, whereupon the MR signals are received by the RF coil after the emission of the RF pulse series has ceased. The received MR signals are re-composed into the corresponding image, whereby the MR image is obtained.

The above detection operation can be repeated on every voluntary section of the sample 15 in the X-, Y- and Z-coordinates to obtain the MR image or, if necessary, the spectrum corresponding thereto. By analyzing the image or the spectrum obtained, the contemplated quality assessment, the analysis of the constituent components and so on of the sample are attained.

After the determination of the sample 15, the sample exchange control device 20 is operated so as to give out a command signal to open the valve 22b, whereby compressed air is supplied to the sample chamber 11 from a compressor 24 via the suction-compression line 21 to blow the sample 15 out of the sample chamber 11 into the autosampler 17 through the sample transfer line 18. When sensors 19b and 19a have detected the passage of the sample 15, the valve 22b is closed and the supply of the compressed air is ceased. Thereafter, when a new sample 15 is put at the stand-by position at the opening of the sample transfer line 18 in the autosampler 17 by rotating the turn table, the sample exchange control device 20 is renewedly operated to give out the command signals to open the valve 22a, whereby the sample chamber 11 is charged again with another sample 15 by air suction by means of the vacuum pump 23 in the same manner as above to effect the sample exchange. The same operations as above are then followed to obtain the MR image.

The exchange of the sample through the sample transfer line 18 is thus realized under the condition in which the detection unit 10 composed of the sample chamber 11 and the RF-emission-reception set 12 is fixedly settled at a predetermined position in the hollow core space 4, so that any movement of the position of the detection unit 10 due to the sample exchange operation is avoided. Therefore, there is no requirement for repeating the tuning and shimming upon each sample exchange. By performing the operation of tuning and shimming only once at the start of the successive detection operations, accurate observations of samples can be attained repeatedly without incorporating any renewed operation of tuning and shimming. By this, efficient test procedures can be reached with the simultaneous attainment of accurate images due to the guaranteed maintenance of the same test conditions.

The detection unit 10 is supported in the hollow core space 4 by the support member 14 under the condition in which it is isolated both from the static magnetic field generating element 1 and from the gradient magnetic field generating element 2 and the support member 14 itself is also isolated from both the static and the gradient magnetic field generating elements 1 and 2, so that any vibration generated in the static and gradient magnetic field generating elements 1 and 2 is shut off and not transmitted to the detection unit 10. Thus, the shock vibration occuring upon actuation of the magnet coil of the gradient magnetic field generating element 2 is not transmitted to the sample chamber 11 and to the RF-emission-reception set 12, so that an accurate MR image can be obtained without the MR signals received by the RF coil 13 being obstructed by any influence due to the shock vibration.

In this apparatus, the force to be impressed onto the sample chamber 11 upon the sample exchange can be decreased due to the transference of the sample 15 by a vacuum and compressed air, so that any locational displacement of the sample chamber by the sample exchange operation can substantially be eliminated, whereby the test accuracy is increased.

As an example, the apparatus explained above was used as an apparatus for nondestructive quality assessment of rice seed grains adopted as the sample 15 to obtain a MR image and the corresponding spectrum thereof, in order to evaluate its sproutability. The sproutability of the embryo was assessed for the rice seeds "Kinuhikari", which have been conditioned by water-soaking and warming in an incubator at a temperature of 30° C. for 50 hours, as the sample.

In FIG. 3(a), the resulting MR image showing the state of sprouting of an unmilled rice grain given together with its corresponding spectrum (b). Here, the internal structure of the rice grain can be visualized as an image by utilizing the MRI of proton in the water molecule without slicing the grain. The assessment of the sproutability of the grain can be attained from the intensity of the spectrum thereof.

Figure 4B:
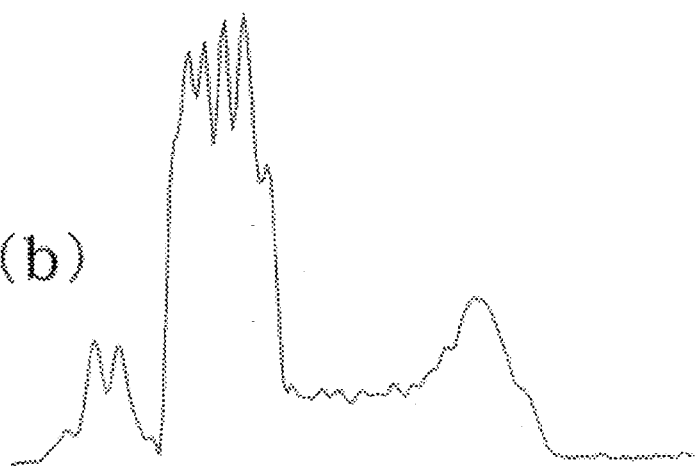
FIGS. 4(a) and 4(b) show an MR image of a grain of unhulled rice, with its corresponding MR spectrum being given in 4(b).
Figure 4A:
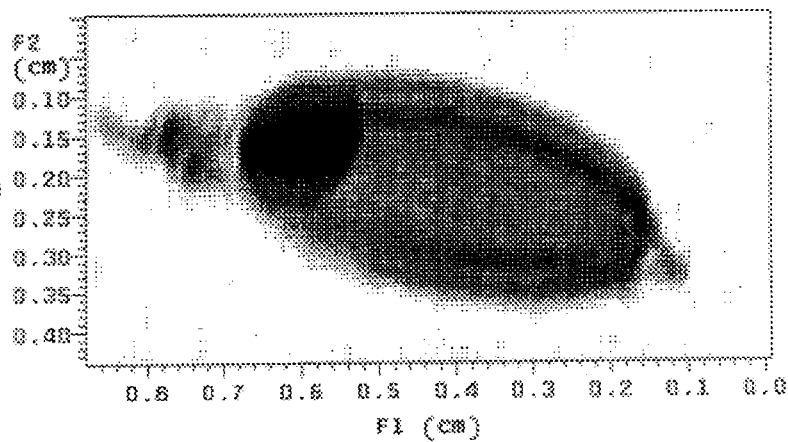
Figure 5:
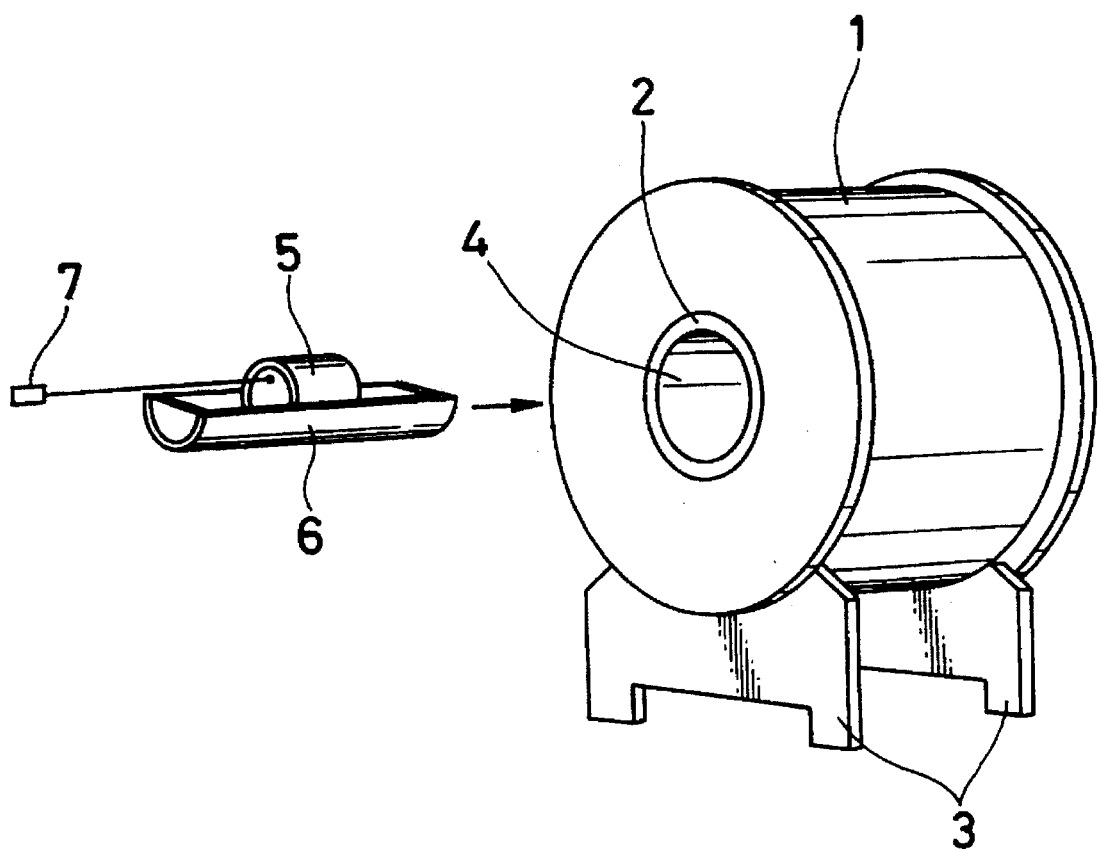
FIG. 5 illustrates a typical conventional MRI apparatus in a perspective view.

In FIG. 4(a), the resulting MR image showing the state of sprouting of an unhulled rice seed is given together with its corresponding spectrum (b). The MR image shows a lesser proportion of high-intensity signals as compared with that of the unmilled rice grain and the spectrum is also weak. Therefore, the sproutability for this is assessed to be lower than that of the unmilled rice grain.

In this manner, seeds exhibiting higher sproutability can be selected by assessing the sproutability of the seeds in a nondestructive way from their MR images and/or the corresponding spectra.

We claim:

1. An apparatus for magnetic resonance imaging of a sample to be inspected, comprising a static magnetic field generating element having a hollow core space for forming a static magnetic field, a gradient magnetic field generating element for forming a gradient magnetic field within said static magnetic field, a detection unit composed of a sample chamber placed within said hollow core space and an RF-emission-reception set, said RF-emission-reception set including an RF coil, a sample transfer device for guiding the sample into and out of said sample chamber by a pressure gradient without effecting any displacement of said sample chamber, a sample holder for holding a sample introduced into said sample chamber in a stationary state, a support member for supporting said detection unit and said sample transfer device at a position such that they are isolated from said static magnetic field generating element and from said gradient magnetic field generating element and a control device for controlling the apparatus so as to cause the forming of the gradient magnetic field by said gradient magnetic field generating element while the sample is in a stationary position within the sample chamber and to conduct emission of an RF pulse and reception of the nuclear magnetic resonance signals by said RF-emission-reception set so as to effect an imaging of the sample.

2. An apparatus as claimed in claim 1, wherein the sample transfer device is constructed so as to guide the sample into the sample chamber by making use of a vacuum and out of the sample chamber by making use of a compressed air.

3. A method for realizing a magnetic resonance imaging of a sample to be inspected, comprising supporting, within a hollow core space in which a static magnetic field is formed by a static magnetic field generating element and a gradient magnetic field is formed by a gradient magnetic field generating element, a detection unit composed of a sample chamber and an RF-emission-reception set, said RF-emission-reception set including an RF coil, at a position such that the detection unit is isolated from said static magnetic field generating element and from said gradient magnetic field generating element, introducing the sample into said sample chamber by means of a pressure gradient without permitting any displacement of said sample chamber, holding the sample introduced into said sample chamber in a stationary state therein by a sample holder and building up a gradient magnetic field by said gradient magnetic field generating element while causing emission of an RF pulse and reception of the magnetic resonance signals for the sample by said RF-emission-reception set including the RF coil to obtain a magnetic resonance image and corresponding spectrum.

\* \* \* \* \*